(12) United States Patent
Fornara

(10) Patent No.: US 11,088,241 B2
(45) Date of Patent: Aug. 10, 2021

(54) PIN DIODE INCLUDING A CONDUCTIVE LAYER, AND FABRICATION PROCESS

(71) Applicant: STMicroelectronics (Rousset) SAS, Rousset (FR)

(72) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/739,753

(22) Filed: Jan. 10, 2020

(65) Prior Publication Data

US 2020/0227517 A1 Jul. 16, 2020

(30) Foreign Application Priority Data

Jan. 16, 2019 (FR) ........................................ 1900384
Jan. 16, 2019 (FR) ........................................ 1900385

(51) Int. Cl.

| | | |
|---|---|---|
| *H01L 29/00* | (2006.01) | |
| *H01L 29/04* | (2006.01) | |
| *H01L 29/66* | (2006.01) | |
| *H01L 29/861* | (2006.01) | |
| *H01L 29/868* | (2006.01) | |

(52) U.S. Cl.
CPC .......... *H01L 29/04* (2013.01); *H01L 29/6609* (2013.01); *H01L 29/868* (2013.01); *H01L 29/8615* (2013.01)

(58) Field of Classification Search
None
See application file for complete search history.

(56) References Cited

U.S. PATENT DOCUMENTS

| | | |
|---|---|---|
| 2011/0169126 A1 | 7/2011 | Chen et al. |
| 2012/0205751 A1 | 8/2012 | Ohguro |

FOREIGN PATENT DOCUMENTS

| | | |
|---|---|---|
| EP | 0458570 A1 | 11/1991 |

OTHER PUBLICATIONS

"On the order of." Collins English Dictionary, https://www.collinsdictionary.com/US/dictionary/english/of-the-order-of (Jan. 12, 2021). (Year: 2021).*
INPI Search Report and Written Opinion for FR 1900384 dated Oct. 1, 2019 (9 pages).
INPI Search Report and Written Opinion for FR 1900385 dated Nov. 8, 2019 (11 pages).
Chern H N et al: "The Effects of Fluorine Passivation on Polysilicon Thin Film Transistors" IEEE Transactions on Electron Devices IEEE Service Center Piscataway NJ US vol. 41 No. 5 May 1, 1994 pp. 698-702.

(Continued)

*Primary Examiner* — Reema Patel
(74) *Attorney, Agent, or Firm* — Crowe & Dunlevy

(57) ABSTRACT

A diode is formed by a polycrystalline silicon bar which includes a first doped region with a first conductivity type, a second doped region with a second conductivity type and an intrinsic region between the first and second doped regions. A conductive layer extends parallel to the polycrystalline silicon bar and separated from the polycrystalline silicon bar by a dielectric layer. The conductive layer is configured to be biased by a bias voltage.

40 Claims, 7 Drawing Sheets

(56) References Cited

OTHER PUBLICATIONS

Ming Dou Ker et al: "On Chip High Voltage Charge Pump Circuit in Standard CMOS Processes With Polysilicon Diodes" 2005 IEEE Asian Solid State Circuits Conference Nov. 1-3, 2005 Hsinchu Taiwan IEEE Piscataway JN Nov. 1, 2005 pp. 157-160.
Jamshidi-Roudbari A et al: "Voltage Noise Characteristics of Polysilicon P-I-N Diodes" IEEE Transactions on Electron Devices, IEEE Service Center Pisacataway NJ vol. 58 No. 4, Mar. 10, 2011 PA.
Stewart M et al: "High Performance Gated Lateral Polysilicon Pin Diodes" Solid State Electronics Elsevier Science Publishers Barking GB, vol. 44 No. 9, Sep. 1, 2009, pp. 1613-1619.

* cited by examiner

PIN DIODE INCLUDING A CONDUCTIVE LAYER, AND FABRICATION PROCESS

PRIORITY CLAIM

This application claims the priority benefit of French Application for Patent Nos. 1900384 and 1900385, both filed on Jan. 16, 2019, the contents of which are hereby incorporated by reference in their entireties to the maximum extent allowable by law.

TECHNICAL FIELD

Embodiments and implementations relate to diodes, in particular to those formed in polycrystalline silicon and including an intrinsic zone.

BACKGROUND

The leakage current in $P^+$-$N^-$ or $N^+$-$P^-$ junctions of diodes is strongly linked to the dopant density on the least doped ($N^-$ or $N^-$) side. The higher the doping level, the greater the leakage current under reverse bias. However, if the doping level is decreased, the current when the diode is in the on state is also decreased.

This trade-off has made it difficult to produce lateral diodes made of polysilicon with a large on-state current and a small leakage current.

PIN (positive-intrinsic-negative) diodes are diodes comprising an intrinsic, i.e. undoped, zone intercalated between a P-doped zone and an N-doped zone.

Decreasing the length of the intrinsic zone between the two doped regions makes it possible to improve the ratio of on-state current to leakage current, but this decrease is limited by the diffusion of the dopants from the doped regions.

However, it is desirable to increase the ratio of on-state current to leakage current of the PIN diodes while avoiding additional expenses being introduced into the fabrication processes.

SUMMARY

According to one aspect, what is proposed is a diode comprising a polycrystalline silicon bar including a first doped region with a first conductivity type, a second doped region with a second conductivity type and an intrinsic region that is located between the first doped region and the second doped region, and a conductive layer that is capable of being biased, parallel to the polycrystalline silicon bar and separated from said bar by a dielectric layer.

Since the conductive layer is capable of being biased, i.e. it includes for example a contact that may be coupled to a bias voltage, and since it is parallel to the bar, the conductive layer allows the characteristics of the diode to be modulated according to the bias, in particular the reverse leakage current in the off state. A positive or negative bias allows the reverse leakage current flowing through the polycrystalline silicon intrinsic region to be boosted or moderated, respectively. Modulating the current in this way allows the leakage current to be decreased and thus the ratio of on-state current to leakage current to be increased.

For example, the thickness of the polycrystalline silicon bar is 150 nm or 100 nm.

According to one embodiment, the dielectric layer includes a portion that is thinner than the rest of the dielectric layer, facing the intrinsic region.

In particular, this allows the effect of boosting and moderating the current to be sized to potentials of an order of magnitude that is available in a given circuit.

For example, the thickness of the thinner portion is substantially 2.3 nm or between 7 nm and 9 nm, and the thickness of the rest of the dielectric layer is substantially 15 nm or substantially 18 nm.

According to one embodiment, the polycrystalline silicon bar rests on the dielectric layer, which itself rests on the conductive layer that is capable of being biased.

According to one exemplary embodiment, the conductive layer is located on a surface on a front face of a semiconductor substrate.

According to another exemplary embodiment, the conductive layer is located in a trench extending vertically into a semiconductor substrate from a front face of the semiconductor substrate.

The front face of the semiconductor substrate corresponds to the surface of the substrate on which the semiconductor components are produced (also referred to by the acronym FEOL, for "front end of line").

According to one embodiment, the diode comprises an electrical circuit coupling the first doped region of the polycrystalline silicon bar with the conductive layer.

Naturally, the first doped region corresponds to an anode region of the diode so as to take advantage of the leakage current-moderating effect in the off state.

According to one embodiment, the diode comprises a second conductive layer that is capable of being biased, parallel to the polycrystalline silicon bar and separated from said bar by a second dielectric layer.

In this embodiment, a first conductive layer and a second conductive layer, on one side and on the other side of the polycrystalline bar, respectively, may allow a dual current-modulating effect. The second conductive layer further allows an advantageous implementation of the fabrication of the diode.

For example, the thickness of the second conductive layer is 150 nm while the thickness of the polycrystalline silicon bar is 100 nm.

Advantageously, the second dielectric layer includes a portion that is thinner than the rest of the second dielectric layer, facing the intrinsic region.

The second conductive layer may rest on the second dielectric layer, which itself rests on said polycrystalline silicon bar.

For example, the thickness of said thinner portion of the second dielectric layer is substantially 2.3 nm while the thickness of the rest of the second dielectric layer is substantially 15 nm.

Similarly, the diode may comprise a second electrical circuit coupling the first doped region of the polycrystalline silicon bar with the second conductive layer.

Furthermore, the diode may include an isolating region electrically isolating the diode from a semiconductor substrate.

For example, the isolating region may be a shallow trench isolation, or form a dielectric layer on the parts of the conductive region facing the substrate.

The polycrystalline silicon bar may further include fluorine atoms at least in said intrinsic region.

This allows the ratio of on-state current to leakage current of the diode to be further improved.

According to another aspect, what is proposed is a process for fabricating a diode comprising an operation of forming a polycrystalline silicon bar, an operation of implanting dopants with a first conductivity type into a first region of the bar, and an operation of implanting dopants with a second conductivity type into a second region of the bar, a region of the bar located between the first region and the second region being left intrinsic, as well as an operation of forming a conductive layer that is capable of being biased parallel to the polycrystalline silicon bar, and an operation of forming a dielectric layer separating the conductive layer and the polycrystalline silicon bar.

For example, said operation of forming the polycrystalline silicon bar is configured to form a polycrystalline silicon bar with a thickness of 150 nm or 100 nm.

According to one implementation, the operation of forming the dielectric layer includes an operation of forming a portion that is thinner than the rest of the dielectric layer, facing the intrinsic region.

For example, said operation of forming the dielectric layer is configured to form the thinner portion with a thickness of substantially 2.3 nm or a thickness of between 7 nm and 9 nm, and to form the rest of the dielectric layer with a thickness of substantially 15 nm or of substantially 18 nm.

According to one implementation, said operation of forming the polycrystalline silicon bar is carried out on the dielectric layer, and said operation of forming the dielectric layer is carried out on the conductive layer.

According to one exemplary implementation, the operation of forming the conductive layer is carried out on a surface located on a front face of a semiconductor substrate.

According to another exemplary implementation, the operation of forming the conductive layer comprises an operation of etching a trench extending vertically into a semiconductor substrate from a front face of the substrate, and an operation of filling the trench with the conductive layer.

According to one implementation, the process comprises an operation of producing an electrical circuit coupling the first doped region of the polycrystalline silicon bar with the conductive layer.

According to one implementation, the process comprises an operation of forming a second conductive layer that is capable of being biased parallel to the polycrystalline silicon bar, and an operation of forming a second dielectric layer separating the second conductive layer and the polycrystalline silicon bar.

In addition to producing a diode having the advantages mentioned above, this implementation makes it possible to avoid introducing a step for protection from silicidation, which was possibly not envisaged in a fabrication process, through the use of a step of depositing a second conductive layer, which was possibly envisaged in the process.

For example, the operation of forming the second conductive layer is configured to form the second conductive layer with a thickness of 150 nm, the operation of forming the first conductive layer being configured to form the first conductive layer with a thickness of 100 nm.

Advantageously, the operation of forming the second dielectric layer includes an operation of forming a portion that is thinner than the rest of the second dielectric layer, facing the intrinsic region.

For example, the operation of forming the second conductive layer is carried out on the second dielectric layer, and said operation of forming the second dielectric layer is carried out on the polycrystalline silicon bar.

For example, said operation of forming the second dielectric layer is configured to form the thinner portion with a thickness of substantially 2.3 nm.

The process may include an operation of producing a second electrical circuit coupling the first doped region of the polycrystalline silicon bar with the second conductive layer.

Furthermore, the process may include an operation of forming an isolating region electrically isolating the diode from a semiconductor substrate.

The process according to this aspect advantageously has steps for forming elements that are already envisaged in typical processes for fabricating semiconductor components on the same integrated circuit as the diode. The process according to this aspect is even entirely compatible with an exemplary process for producing floating-gate transistor non-volatile memory, and hence "gratis".

The process may further include an operation of implanting fluorine atoms at least into said intrinsic region of the polycrystalline silicon bar, and potentially into the entirety of the polycrystalline silicon bar.

BRIEF DESCRIPTION OF THE DRAWINGS

Other advantages and features of the invention will become apparent on examining the detailed description of completely non-limiting embodiments and implementations, and the appended drawings, in which.

DETAILED DESCRIPTION

Figure 1:
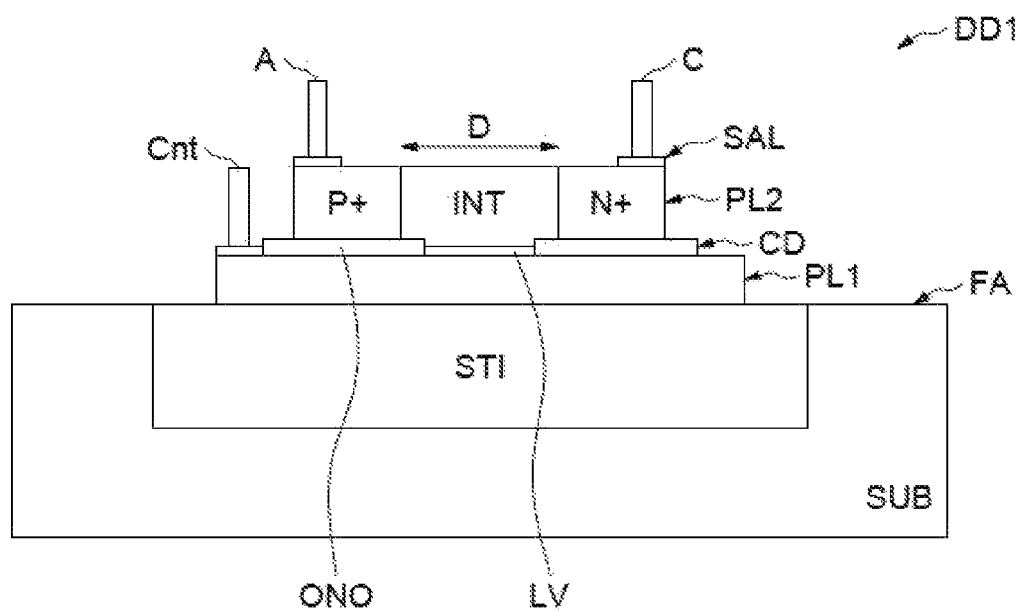
FIG. 1 illustrates one exemplary embodiment of a diode.

FIG. 1 illustrates one exemplary embodiment of a PIN (positive-intrinsic-negative) diode DD1 comprising a first, $P^+$-doped region, a second, $N^+$-doped region and an intrinsic, undoped, region INT intercalated between the first, $P^+$-doped region and the second, $N^+$-doped region.

The first, $P^+$-doped region, the intrinsic region INT and the second, $N^+$-doped region are produced in a polycrystalline silicon bar PL2, i.e. a polycrystalline silicon layer or plate, which may be elongate.

For example, the thickness of the polycrystalline silicon bar PL2 may be 150 nm.

The term "polysilicon" may be used to refer to polycrystalline silicon.

The first, $P^+$-doped region forms the anode A of the diode DD1 and the second, $N^+$-doped region forms the cathode C of the diode DD1.

Metal anode A and cathode C contacts are shown and coupled to the first, $P^+$-doped region and to the second, $N^+$-doped region via metal silicide films SAL.

The diode DD1 further comprises a conductive layer PL1 that is parallel to the polycrystalline silicon bar PL2 and separated from the bar PL2 by a dielectric layer CD.

The conductive layer PL1 may, for example, be formed of doped and conductive polysilicon. The conductive layer PL1 may further comprise a metal silicide film allowing ohmic coupling with a metal contact Cnt. This is an example allowing the conductive layer PL1 to be capable of being biased.

For example, the thickness of the conductive layer PL1 may be 100 nm.

The dielectric layer CD includes a portion LV and a portion ONO. The portion LV is thinner than the rest of the dielectric layer ONO (portion ONO). The thinner layer (portion LV) is located facing the intrinsic region INT.

The thinner portion LV of the dielectric layer includes, for example, a silicon oxide layer that is used to produce gate oxides of logic MOS transistors. For example, the thickness of the portion LV may be substantially 2.3 nm (i.e. to within 10%).

The rest of the dielectric layer CD, which is thicker, includes, for example, a stack ONO of layers of silicon oxide, silicon nitride and silicon oxide. For example, the thickness of the portion ONO may be substantially 15 nm.

In this example, the polycrystalline silicon bar PL2 rests on the dielectric layer CD, which itself rests on the conductive layer PL1.

As for the conductive layer PL1, it rests on a surface on a front face FA of a semiconductor substrate SUB on which the diode DD1 is produced. The front face FA of the substrate SUB is the face on which the semiconductor components, such as the diode DD1, transistors, etc., are formed.

The conductive layer PL1 rests, in this example, on a zone of the substrate that is provided with a shallow trench isolation STI. Shallow trench isolations STI comprise an electrically isolating region filling trenches, the uppermost level of which is aligned with the surface of the front face FA.

The shallow trench isolation here forms an isolating region electrically isolating the diode DD1 from the semiconductor substrate SUB.

Figure 2:
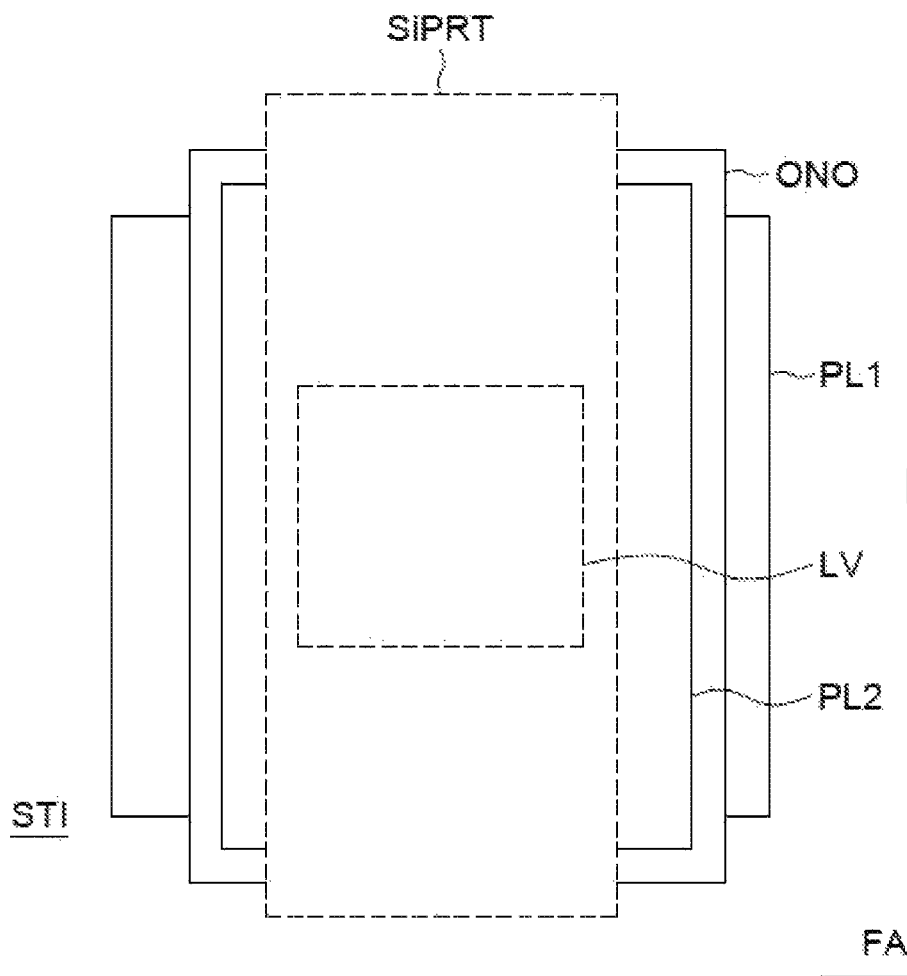
FIG. 2 illustrates a top view of a device.

FIG. 2 illustrates a top view of a device after certain steps of one exemplary process for fabricating a diode, such as the diode DD1 described above with reference to FIG. 1.

Thus, this exemplary process comprises an operation of forming an isolating region STI so as to electrically isolate the diode from a semiconductor substrate. The isolating region is fabricated according to a conventional method for forming shallow trench isolations. The uppermost surface of the isolating region STI is thus level with the front face FA of the semiconductor substrate on which the diode is produced.

The process comprises an operation of forming the conductive layer PL1 on the surface that is located on the front face FA of the semiconductor substrate.

The operation of forming the conductive layer PL1 comprises, for example, an operation of growing a polysilicon layer and an operation of doping this layer so as to make it conductive, followed by a masking operation, defining the parts to be removed, and an etching operation.

Next, the process comprises an operation of forming the dielectric layer that is intended to separate the conductive layer PL1 and the future polycrystalline silicon bar PL2.

The operation of forming the dielectric layer comprises operations of growing or depositing stacked silicon oxide, nitride and oxide ONO.

Next, the stack ONO is completely etched over a part LV, located facing the future intrinsic region INT of the polysilicon bar PL2. An oxide that is thinner than the stack ONO is formed in the etched part LV.

The polysilicon bar PL2 is then formed on the dielectric layer (including the stack ONO and the thinner oxide LV).

The polysilicon bar PL2 may be formed by depositing a polycrystalline silicon layer followed by a masking operation, defining the parts to be removed, and an etching operation.

The process comprises an operation of implanting dopants of a first conductivity type into a first region of the bar forming an anode and an operation of implanting dopants of a second conductivity type into a second region of the bar forming a cathode, which are spaced apart from one another by a region of the bar that is left intrinsic (not shown).

Additionally, a protective mask SiPRT is deposited so as to protect the intrinsic region INT in particular from silicidation.

The exposed parts of the polysilicon bar PL2, facing the anode and cathode regions, are then silicided, i.e. they include a metal silicide film, and may be connected by ohmic contact.

Similarly, those parts of the conductive layer PL1 which are not covered by the protective mask SiPRT, by the bar PL2 or by the dielectric layer ONO are also silicided.

Thus, a contact that is coupled to the metal silicide film allows the conductive layer PL1 to be biased.

The various layers PL1, ONO and PL2 are formed "pyramidally", the area of each layer being entirely included within the area of the subjacent layer.

Figure 3:
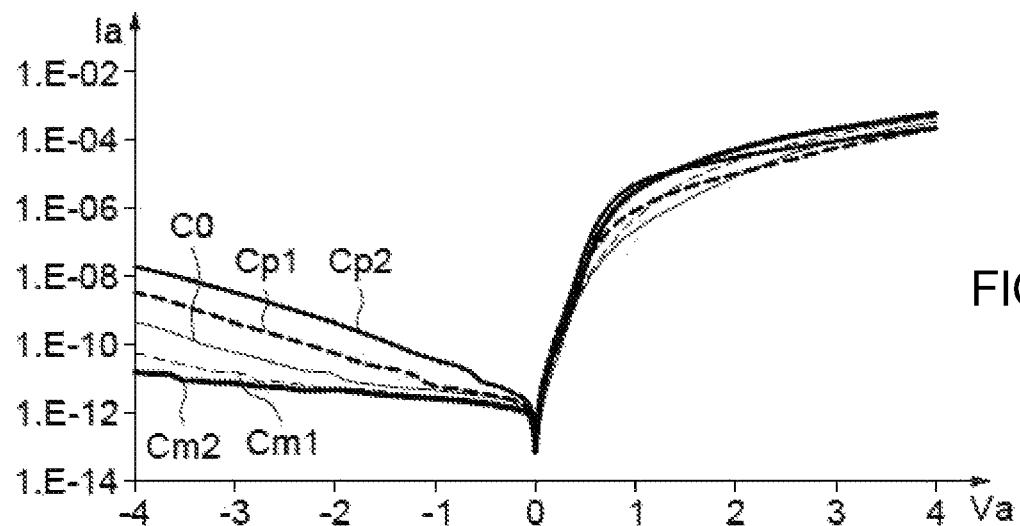
FIG. 3 illustrates characteristic curves of the anode current as a function of the anode voltage of a diode.

FIG. 3 illustrates characteristic curves of the anode current Ia as a function of the anode voltage Va of a diode, such as the diode DD1 described above with reference to FIG. 1, for various biasing voltage levels Vpol of the conductive layer PL1.

Five curves are shown for five bias voltages Vpol, and are denoted by Cm2 for Vpol=−2 V, Cm1 for Vpol=−1 V, C0 for Vpol=0 V, Cp1 for Vpol=+1 V and Cp2 for Vpol=+2 V.

In the on state, i.e. for positive anode voltages Va, the various biasing voltages Vpol of the conductive layer PL2 have little effect on the anode current Ia, in particular for anode voltages above 1.5 V.

However, in the off state, i.e. for negative anode voltages Va, the effect of the biasing voltage Vpol of the conductive layer PL2 is readily apparent in the values of the leakage current Ia.

Specifically, the biasing of the conductive layer PL2, parallel to the polysilicon bar PL1, produces an effect that is comparable to a transistor effect in the intrinsic region INT, which modulates the carrier concentration in the intrinsic region and the conductivity of the diode.

The intensity of the leakage current Ia is thus modulated by the bias voltage Vpol, and, for example at an anode voltage Va of −4 V, the leakage current of Cm2 (Vpol=−2 V) is substantially $10^{-11}$ amperes, the leakage current of Cp2 (Vpol=+2 V) is substantially $10^{-8}$ amperes while the leakage current of C0 (Vpol=0 V) is substantially $10^{-9}$ amperes.

Thus, it is possible to decrease the leakage current by two to three orders of magnitude ("decades") by biasing Vpol the conductive layer PL1 parallel to the bar PL2, of the order of 2 V.

It is noteworthy that bias voltages Vpol of the order of +/−2 V allow the leakage current of the diode in the off state to be moderated tangibly. This is due to the presence of a portion LV in the dielectric layer that is thinner than the rest of the layer, located facing the intrinsic region INT.

If the dielectric layer includes only one stack ONO, without a thinner portion, the bias voltages Vpol providing a comparable effect are of the order of 10 to 15 V. This may be envisaged in the case that the circuit is easily able to take advantage of such voltage levels, and potentially if it is desirable to avoid forming the thinner portion LV in the dielectric layer.

To take advantage of the leakage current-decreasing effect, Vpol=Va will be chosen.

The diode of the same type as the diode DD1 described with reference to FIG. 1 may thus advantageously comprise an electrical circuit connecting the anode region P+ of the polysilicon bar PL2 with the conductive layer PL1.

Thus, a bias voltage Vpol allowing the leakage current to be advantageously decreased at a given anode voltage Va is directly transmitted by the electrical coupling of the conductive layer PL1 with the anode region, and Vpol=Va.

Figure 4:
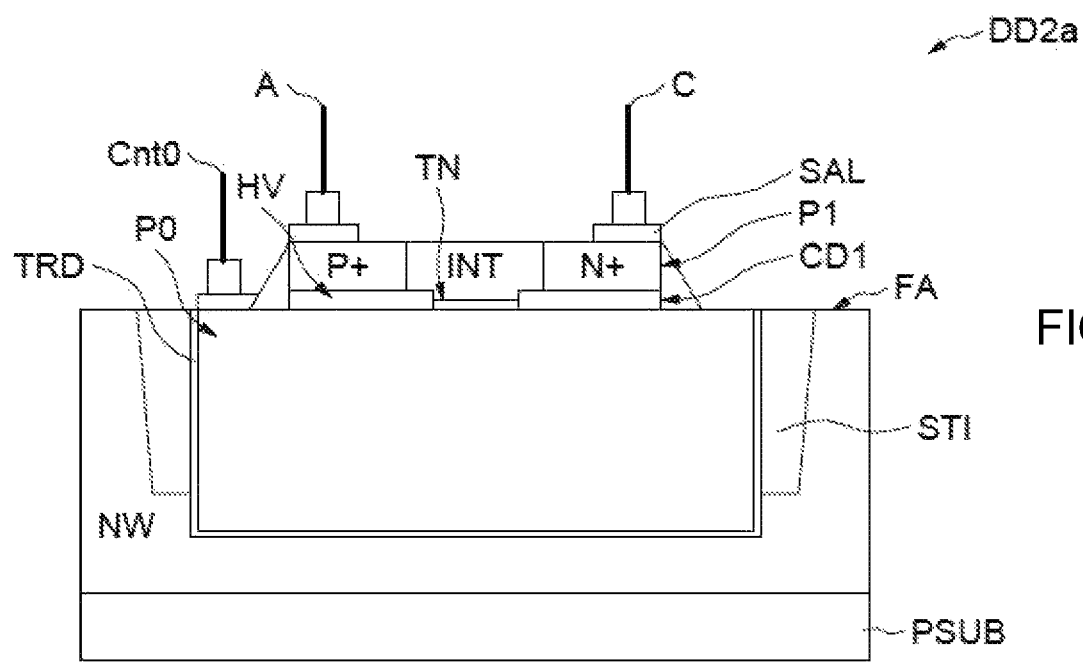
FIG. 4 illustrates one exemplary embodiment of a diode.

FIG. 4 illustrates another exemplary embodiment of a PIN diode DD2a in a polysilicon bar P1 comprising a conductive layer P0, parallel to the bar P1 and separated from said bar by a dielectric layer CD1.

Like in the exemplary embodiment described above, the diode DD2a includes, in the bar P1, a first, anode region A doped with a first conductivity type P+, a second, cathode region C doped with a second conductivity type N+ and an intrinsic region INT.

As such, in this example, the conductive layer P0 is located in a trench extending vertically into a semiconductor substrate PSUB from the front face FA of the substrate.

The substrate PSUB, for example a p-type substrate, potentially includes an n-type well NW in which, and on which, the diode DD2a is produced.

The conductive layer P0 comprises, on the bottom and the sides of the trench in which it is formed, an isolating envelope TRD, such as a silicon oxide used as a gate oxide for vertical transistors.

The isolating envelope TRD on the bottom and the sides of the trench forms an isolating region allowing the diode to be electrically isolated from the semiconductor substrate, in this instance from the well NW of the semiconductor substrate PSUB.

In the orientation of FIG. 4, the polysilicon bar P1 rests on the dielectric layer CD1, which itself rests on the conductive layer P0. For example, the thickness of the polysilicon bar P1 may be 100 nm.

For example, the dielectric layer CD1 comprises what is referred to as a high-voltage oxide layer HV, which is thick enough to withstand voltages above 10 V, and a portion TN that is thinner than the rest of the layer, for example of floating-gate transistor tunnel-oxide type. The thinner portion TN is located facing the intrinsic region INT of the polysilicon bar P1.

For example, the thickness of the high-voltage oxide layer HV may be substantially 18 nm while the thickness of the thinner portion TN may be between 7 nm and 9 nm.

The diode also includes anode A and cathode C contacts that are coupled to the doped regions P+ and N+ via a metal silicide film. A contact Cnt0 is coupled to the conductive layer P0 made of polysilicon via a metal silicide film SAL.

In a similar way to the example described above with reference to FIG. 3, the diode DD2a may comprise an electrical circuit connecting the anode contact A with the contact Cnt0 of the conductive layer P0, according to one advantageous embodiment.

The metal silicide films on the P+- and N+-doped regions and the conductive layer P0 made of polysilicon are produced in one and the same silicidation step.

The silicidation operation may require the use of a protective mask, of the same type as the protective mask SiPRT mentioned above with reference to FIG. 2, so as to avoid a short circuit between the anode and the cathode caused by a silicided film along the polysilicon bar P1.

However, this type of protective layer SiPRT may not be envisaged in a given process for fabricating an integrated circuit, and thus it may be desirable to omit it.

Figure 5:
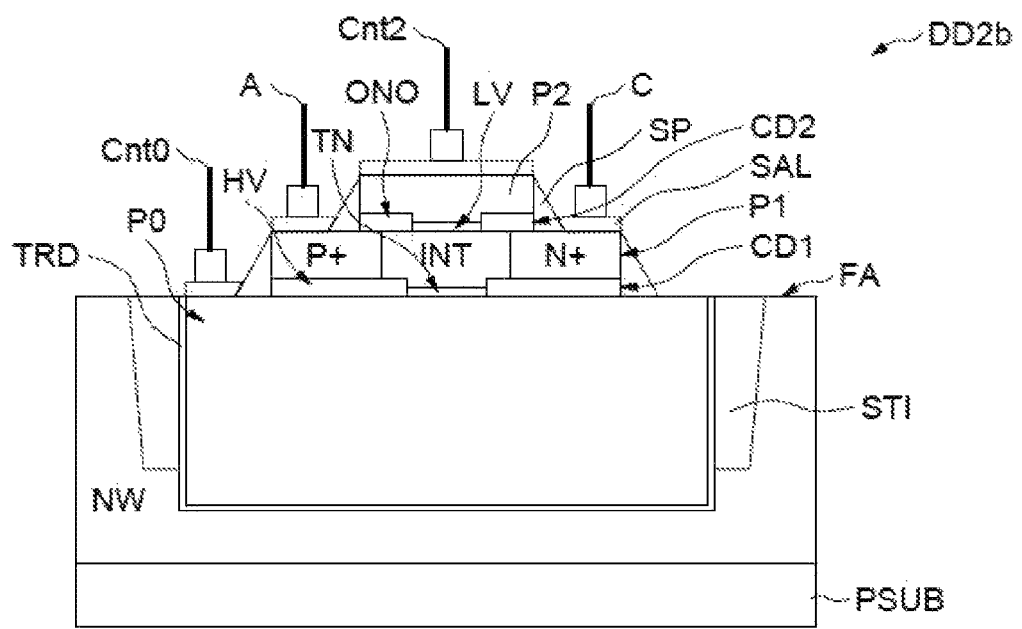
FIG. 5 illustrates one exemplary embodiment of a diode.

FIG. 5 shows one alternative allowing the use of such a layer for protection from silicidation to be avoided in the production of the diode DD2a.

The references in FIG. 5 shared with the preceding FIGS. 1-4 denote the same items and will not be described in detail again.

In this alternative, the diode DD2b comprises an additional layer P2 resting on a second dielectric layer CD2 covering the polysilicon bar P1, apart from at the anode A and cathode C contacts.

The additional layer P2 is, for example, also an advantageously conductive polysilicon layer, and may include spacers SP on its flanks. These spacers are the dielectric elements that typically surround the flanks of the gates of transistors, and are conventional and known per se in design. For example, the thickness of the additional layer P2 may be 150 nm.

The additional layer P2 thus forms a second conductive layer, and is separated from the bar P1 by a second dielectric layer CD2 and by the spacers SP, if applicable.

Thus, the additional layer P2 protects the central part of the bar P1 from silicidation along its entire length, in particular all the way along the intrinsic region INT.

Since it is formed of polysilicon, the surface of the additional layer P2 comprises a silicided film. The second dielectric layer CD2 and the spacers SP make it possible to avoid a short circuit between the anode and the cathode.

Thus, the second conductive layer P2 comprising a metal silicide film forms one exemplary embodiment of a second conductive layer P2 that is capable of being biased, parallel to the polycrystalline silicon bar P1.

The second dielectric layer CD2, in the present embodiment, may be likened to the formation of the dielectric layer (CD) that separates the polysilicon bar PL2 from the conductive layer PL1 in the exemplary embodiment DD1 described above with reference to FIG. 1.

Thus, the second dielectric layer CD2 includes a portion LV that is thinner than the rest of the second dielectric layer ONO, facing the intrinsic region INT of the polysilicon bar P1.

In the orientation of this configuration, the second conductive layer P2 rests on the second dielectric layer CD2, which itself rests on said polysilicon bar P1.

The effect described above with reference to FIG. 3 may be obtained both by biasing the conductive layer P0 and by biasing the second conductive layer P2.

Thus, the diode may advantageously comprise a second electrical circuit electrically coupling the anode region A and the second conductive layer P2. To this end, the second conductive layer P2 may comprise a contact Cnt2 that is electrically connected to the anode contact A and potentially also to the contact Cnt0 of the conductive layer P0 formed in a trench.

Figure 6:
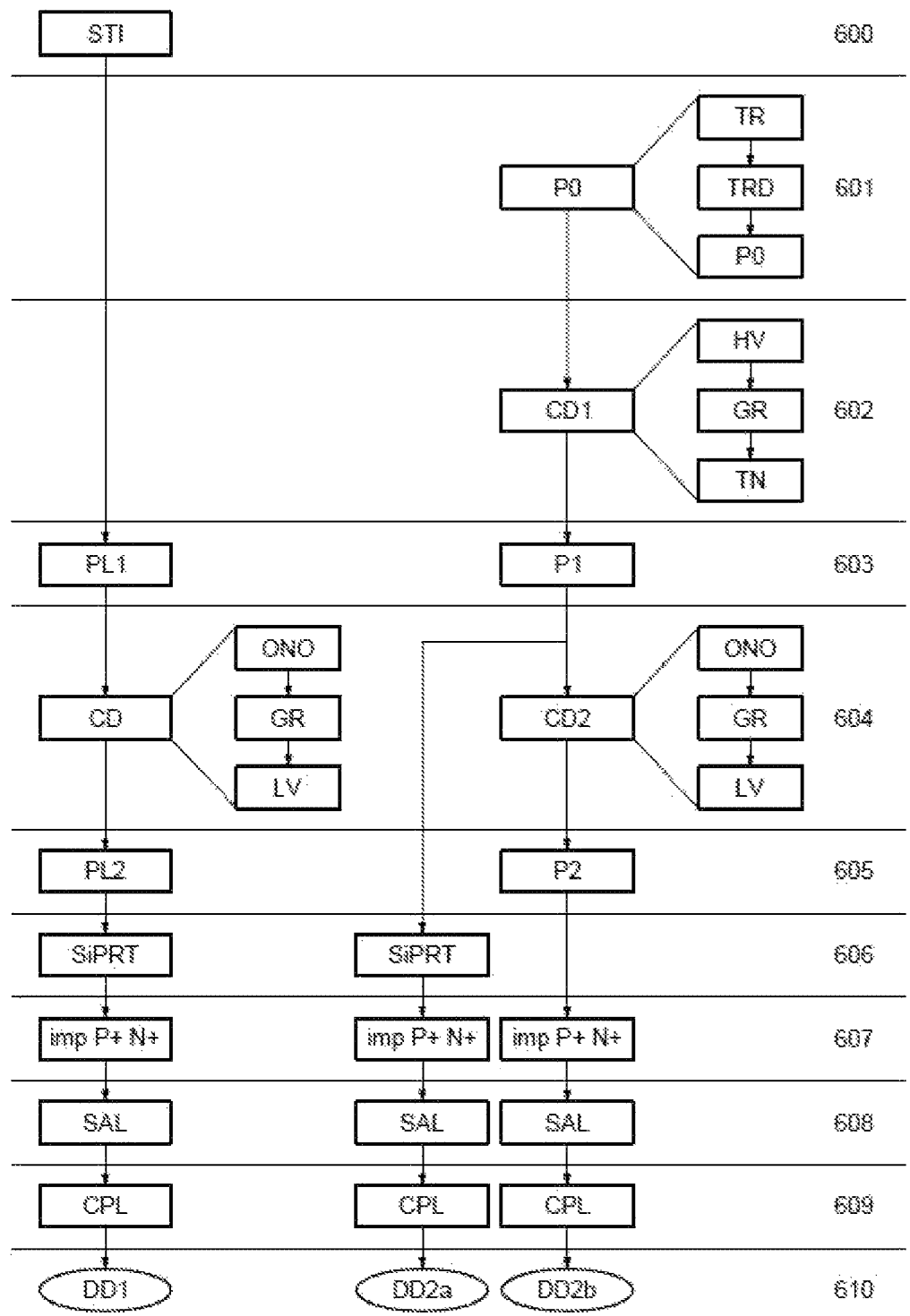
FIG. 6 illustrates a process for fabricating a diode.

FIG. 6 illustrates exemplary implementations of processes for fabricating diodes DD1, DD2a and DD2b of the same type as those described above with reference to FIGS. 1, 4 and 5.

The term "first alternative" will be used to refer to the operation of fabricating a diode DD1 of the same type as that described with reference to FIG. 1, the term "second alternative" will be used to refer to the operation of fabricating a diode DD2a of the same type as that described with reference to FIG. 4 and the term "third alternative" will be used to refer to the operation of fabricating a diode DD2b of the same type as that described with reference to FIG. 5.

The examples according to these three alternatives are presented with reference to 11 steps envisaged for an exemplary process for producing a non-volatile memory. Thus, the examples described here constitute advantageous implementations since they are "gratis" in the context of fabricating a non-volatile memory because they use same steps.

Hereinafter, each step 600-610 will be described according to the example of fabricating a non-volatile memory, then in relation to each alternative for fabricating a diode.

An initial step 600 comprises an operation of forming shallow trench isolations in a semiconductor substrate.

In the first alternative, the initial step 600 may correspond to an operation of forming an isolating region STI in a semiconductor substrate, so as to electrically isolate the diode from the substrate. The second and third alternatives may or may not comprise the initial step 600, potentially for other purposes.

A first step 601 comprises an operation of forming a buried gate region of a vertical gate transistor, for example an access transistor of a memory cell.

The operation of forming the buried gate region comprises an operation of etching a trench TR extending vertically into a semiconductor substrate from a front face of the substrate, an operation of forming an isolating gate-oxide region TRD on the flanks and the bottom of the trench TR and an operation of filling the trench with a conductive layer P0, for example made of polysilicon.

In the first alternative, this step is not implemented in the production of the diode DD1.

In the second and third alternatives, this may correspond to an operation of forming a conductive layer P0 that is capable of being biased parallel to the polycrystalline silicon bar, and to an operation of forming an isolating region TRD electrically isolating the diode from a semiconductor substrate.

A second step 602 comprises an operation of forming a floating-gate dielectric layer CD1, of a floating-gate transistor of a memory cell. The operation of forming the floating-gate dielectric layer CD1 includes an operation of forming a high-voltage oxide HV, an operation of etching GR an opening in the oxide HV and an operation of forming a, thinner, tunnel oxide TN in the opening.

For example, the thickness of the oxide layer HV may be substantially 18 nm and the thickness of the tunnel-oxide layer TN may be between 7 nm and 9 nm.

In the first alternative, this step is not implemented in the production of the diode DD1.

In the second and third alternatives, this may correspond to an operation of forming a dielectric layer CD1 separating the conductive layer P0 and the (future) polysilicon bar P1, including an operation of forming a portion TN that is thinner than the rest of the dielectric layer HV, facing the intrinsic region.

A third step 603 comprises an operation of forming the floating gate of the floating-gate transistor, made of conductive doped polysilicon P1/PL1, on the floating-gate dielectric layer CD1.

For example, the thickness of the polysilicon layer P1/PL1 may be 100 nm.

In the first alternative, this may correspond to an operation of forming a conductive layer PL1 parallel to the (future) polycrystalline silicon bar PL2, which is produced on a surface located on a front face of a semiconductor substrate.

In the second and third alternatives, this may correspond to an operation of forming a polycrystalline silicon bar P1.

A fourth step 604 comprises an operation of forming a control-gate dielectric layer CD/CD2 of the floating-gate transistor, comprising an operation of forming a stack ONO of layers of silicon oxide, nitride and oxide. The layer ONO is removed from a logic part of the non-volatile memory by etching GR. A logic MOS transistor gate oxide LV is formed in the logic part.

For example, the thickness of the ONO stack may be substantially 15 nm and the thickness of the gate-oxide layer LV may be substantially 2.3 nm.

In the first alternative, this may correspond to an operation of forming a dielectric layer CD separating the conductive layer P1 and the polysilicon bar P2, including an operation of forming a portion LV that is thinner than the rest of the dielectric layer ONO, facing the intrinsic region.

In the second alternative, this step is not implemented in the production of the diode DD2a.

In the third alternative, this may correspond to an operation of forming a second dielectric layer CD2 separating the (future) second conductive layer (P2) and the polysilicon bar P1, including an operation of forming a portion LV that is thinner than the rest of the second dielectric layer ONO, facing the intrinsic region.

A fifth step 605 comprises an operation of forming the control gate of the floating-gate transistor (and the gate of the logic MOS transistor), made of conductive doped polysilicon P2/PL2, on the control-gate dielectric layer CD/CD2 (ONO and LV).

For example, the thickness of the polysilicon layer P2/PL1 may be 150 nm.

In the first alternative, this may correspond to an operation of forming a polycrystalline silicon bar PL2.

In the second alternative, this step is not implemented in the production of the diode DD2a.

In the third alternative, this may correspond to an operation of forming a second conductive layer P2 parallel to the polycrystalline silicon bar P1.

A sixth step 606 comprises an operation of forming a mask for protection from silicidation, which may be envisaged for part of the non-volatile memory circuit.

In the first and second alternatives, this may make it possible to avoid a short circuit between the poles of the diode in a later silicidation operation (SAL).

In the third alternative, this step is not implemented in the production of the diode DD2b, the third alternative allowing in particular this step to be omitted.

A seventh step 607 comprises operations of implanting $P^+$- and $N^+$-doped regions into the non-volatile memory part and the logic part, for example source and drain regions of the MO S transistors.

In all three alternatives, this corresponds to an operation of implanting dopants of a first conductivity type $P^+$ into a first region of the bar PL2/P1 and to an operation of implanting dopants of a second conductivity type $N^+$ into a second region of the bar PL2/P1, the first region and the second region being spaced apart by an intrinsic region (INT) of the bar PL2/P1.

An eighth step 608 comprises an operation of siliciding the exposed parts of the various polysilicon layers of the circuit.

The silicidation operation forms a metal silicide film allowing ohmic contact with the corresponding polysilicon regions. The conductive layers PL1/P0 and the second conductive layer P2 are thus capable of being biased according to one particular example.

A ninth step 609 comprises forming contacts on silicided parts so as to electrically connect various parts of the preceding formations to one another.

In all three alternatives, this may correspond to an operation of producing an electrical circuit coupling the first doped region P+ of the polysilicon bar PL2/P1 with the conductive layer PL1/P0.

In the third alternative, this may further correspond to an operation of producing a second electrical circuit coupling the first doped region P+ of the polysilicon bar P1 with the second conductive layer P2.

A tenth step 610 may correspond to operations of producing said diodes such as described above with reference to FIGS. 1, 4 and 5.

Additionally, the invention is not limited to these embodiments and implementations but encompasses all variants thereof; for example, the process may of course be implemented independently or benefit from "gratis" compatibility with other formation operations. Likewise, other known elements which are not described here, the effects of which are equivalent to those of the exemplary elements described in the exemplary embodiments, such as the materials used for the conductive and dielectric layers or else the capacity of said conductive layers to be biased, may be envisaged.

Moreover, an operation of implanting fluorine into the intrinsic region of the diode may allow the ratio of on-state current to leakage current of the diode herein to be further improved. Furthermore, implantation of fluorine atoms also in the anode and cathode doped regions may be made. The following description provides details relating to the fluorine doped diode structure and method of making.

Figure 7:
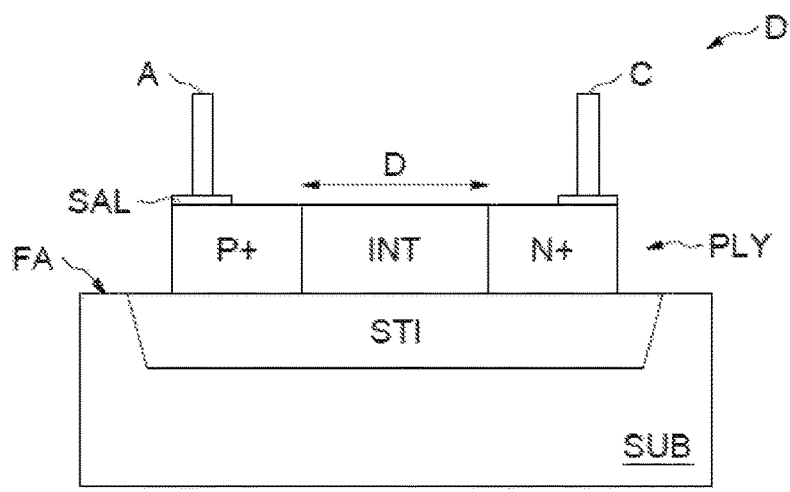
FIG. 7 illustrates an exemplary embodiment of a diode.

FIG. 7 represents an exemplary embodiment of a diode DD of PIN (Positive Intrinsic Negative) type, formed in a polycrystalline silicon bar PLY. The standard term "polysilicon" will be able to be used to denote polycrystalline silicon. The term "bar" is understood to mean a layer of material that may have an elongated plate shape.

The diode DD thus comprises a first polysilicon region doped with a first type of conductivity P+, forming an anode region, and a second polysilicon region doped with a second type of conductivity N+, forming a cathode region.

A polysilicon region INT that is left intrinsic, i.e. undoped, is intercalated between the first doped region P+ and the second doped region N+ in the bar PLY.

The intrinsic polysilicon region INT separates the first doped region P+ and the second doped region N+ by a distance or width D, examples of dimensions of which are given below.

Reducing the width D of the intrinsic region INT makes it possible to improve the ratio of on-state current to leakage current (this ratio will be able to be denoted by the standard expression Ion/Ioff).

That being said, the reduction in the width D is limited by the diffusion of the dopants of the anode and cathode regions and has a critical minimum size.

In order to further increase the Ion/Ioff ratio, without reaching the critical minimum size, the intrinsic polysilicon region INT comprises fluorine atoms.

For example, the fluorine atoms were able to be implanted in the polysilicon bar PLY just after the formation of the bar, optionally in a masked manner in order to confine the implantation to the bar, or even to the intrinsic region INT only. Reference will be made to the options described below in connection with FIGS. 5A and 5B.

Thus, the first doped region P+ and the second doped region N+ may also comprise fluorine atoms.

Furthermore, the diode DD further comprises an isolating region STI that electrically isolates the diode DD from a semiconductor substrate SUB on which the diode is formed.

The isolating region that electrically isolates the diode DD from the substrate SUB makes it possible to prevent leakages to the substrate, advantageously within the context of an embodiment of a PIN-type diode.

In this example, the isolating region STI comprises a formation of shallow isolation trenches (Shallow Trench Isolation) customarily provided in integrated circuits to laterally isolate components formed in the substrate SUB.

The polysilicon bar PLY thus rests on a surface of the isolation region STI, of the shallow isolation trench type, this surface being for example aligned level with a front face FA of the substrate SUB.

The front face FA is typically the face of the substrate SUB on which the semiconductor components of an integrated circuit are created, in the portion of the integrated circuit usually denoted "FEOL" for Front End of Line.

Moreover, an anode contact A is coupled to the first doped region of P+ type, and a cathode contact C is coupled to the second doped region of N+ type.

These contacts A, C are typically coupled to said doped regions by a film SAL of conductive metal silicide formed on the surface of said P+, N+ doped regions.

Typically, a protective hard mask (not represented) covers in particular the intrinsic portion INT of the polysilicon bar PLY. The protective hard mask makes it possible to not form the metal silicide film on the surface of the polysilicon bar PLY that it covers.

Figure 8A:
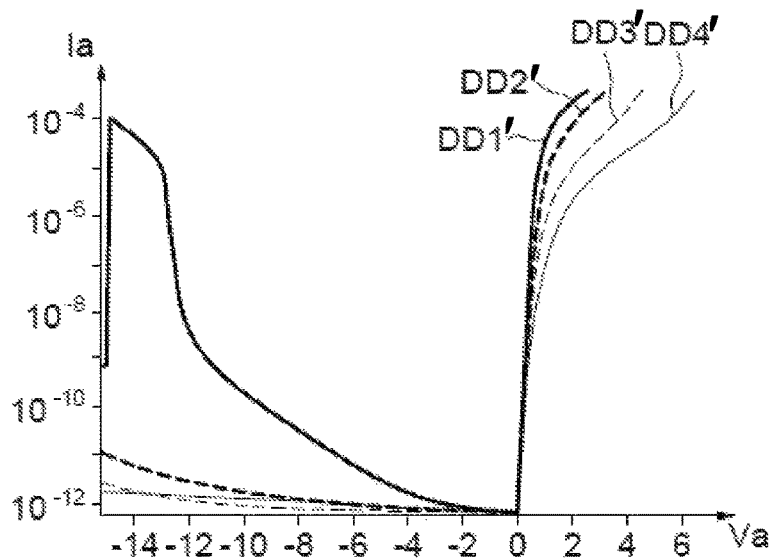
FIG. 8A illustrates change in the anode current as a function of the anode voltage for a diode which includes fluorine.
Figure 8B:
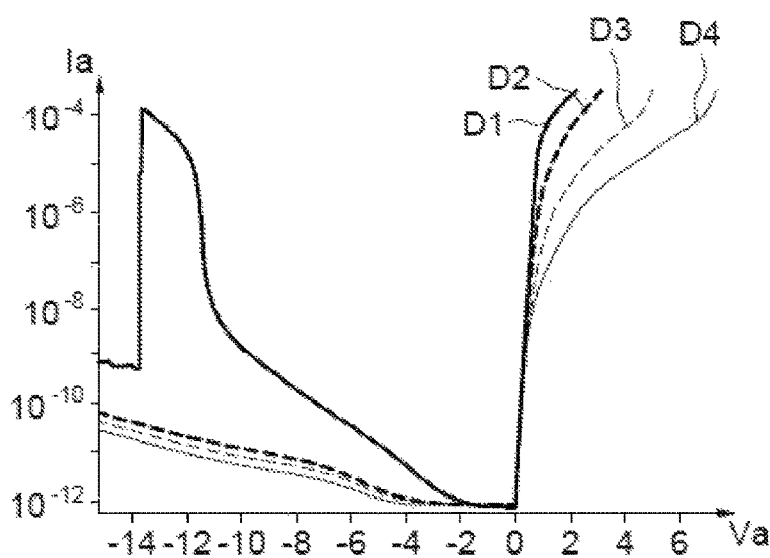
FIG. 8B illustrates change in the anode current as a function of the anode voltage for a diode which does not include fluorine.

FIGS. 8A and 8B together illustrate the improvement in the features of exemplary embodiments of PIN-type diodes, which is obtained by the presence of fluorine atoms in the intrinsic polysilicon region.

FIG. 8A graphs the change in the anode current Ia as a function of the anode voltage Va, for four embodiments of PIN-type diodes DD1', DD2', DD3', DD4'. The designs of the diodes DD1'-DD4' correspond to the diode DD described above in connection with FIG. 7, comprising in particular fluorine atoms in the intrinsic region INT, and for various widths D of the intrinsic region INT.

The widths D of the intrinsic region INT of the diodes DD1', DD2', DD3', DD4' correspond respectively to the critical minimum size, and to three successive increases in this size of identical increment.

In the example of the chosen technology corresponding to FIG. 8A, the critical minimum size of the width D of the diode DD1' is 0.6 µm, and with an increment of 0.3 µm, the width D of the diode DD2' is 0.9 µm, the width D of the diode DD3' is 1.2 µm, the width D of the diode DD4' is 1.5 µm.

FIG. 8B graphs the change in the anode current Ia as a function of the anode voltage Va, but for four embodiments of PIN-type diodes D1, D2, D3, D4 corresponding to the diodes DD1'-DD4', that in this case do not comprise fluorine atoms in the intrinsic region INT.

In FIG. 8A, the measurements of the leakage current Ia in reverse voltage Va, Va<0, of the diodes DD2', DD3', DD4' begin to increase for voltages Va of less than −11 V, or even −12 V. The diode DD1' of critical width carries a leakage current Ia that has a rapid divergent change starting from voltages Va of less than −4V.

Whereas in FIG. 8B, the measurements of the leakage current Ia in reverse voltage Va of the diodes D2, D3, D4 begin to increase for voltages Va of less than −3 V, or even −4 V. The diode D1 of critical width carries a leakage current Ia that has a rapid divergent change, with a course comparable to that of the diode DD1', but starting from voltages Va of less than −2V.

In any event, a comparison of the experimental measurements from FIGS. 8A and 8B shows that the presence of fluorine atoms in the intrinsic polysilicon region INT of the diodes of the types of the diode DD described in connection with FIG. 7, makes it possible to limit the leakage current in reverse bias.

The leakage current is reduced by at least one order of magnitude ("decade") in the diode DD comprising fluorine in the intrinsic region INT, compared to an embodiment of the same diode without fluorine.

In the on-state, for Va>0, the current Ia of the diodes DD1'-DD4' is greater than the current Ia of the diodes D1-D4. The difference in on-state is smaller but nevertheless is present and measurable.

Thus, the presence of fluorine atoms in the intrinsic region of the PIN-type diode DD makes it possible both to increase the on-state current and to reduce the leakage current in reverse bias. The Ion/Ioff ratio is doubly improved thereby.

Physically, this double improvement effect may be modelled by a saturation of the fluorine atoms in the monocrystalline grain boundaries of the polycrystalline silicon. In the grain boundaries, the fluorine atoms occupy crystal defects that can trap electrons.

This type of trapping degrades the conduction when the electronic charges are predominant, i.e. in the on-state. By saturating the defects in the grain boundaries, the fluorine prevents this degradation of the on-state current.

In the off-state, under reverse bias, the electronic charges are not predominant and the leakage current is promoted by the passage of the electrons from one trap to another. Being saturated by the fluorine atoms, these traps will no longer participate, or will participate less, in the conduction of the leakage current.

FIGS. 9 to 12 illustrate various steps of examples of implementation of a process for fabricating such a diode DD.

Figure 9:
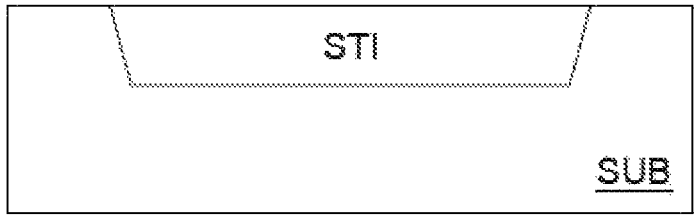
FIGS. 9, 10, 11A, 11B and 12 illustrate various steps of examples of implementation of a process for fabricating a diode.

FIG. 9 represents the result of a step of forming, in a semiconductor substrate SUB, an isolating region STI configured to electrically isolate the (future) diode DD.

The formation of an isolating region STI is advantageously a step provided for productions of other portions of an integrated circuit, such as a conventional production of shallow isolation trenches comprising, briefly, an etching of a trench in the substrate, a filling of the trench with a dielectric and a polishing of the dielectric.

The diode DD will then be formed on the surface of the isolating region STI.

Figure 10:
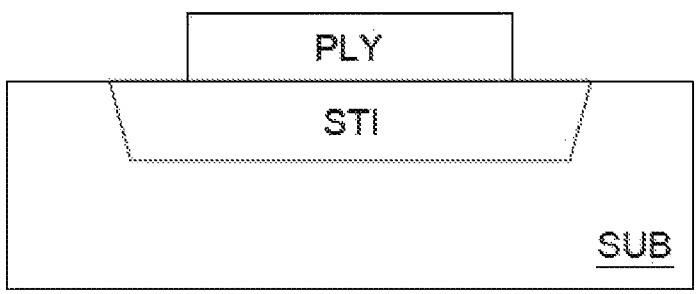

FIG. 10 represents a formation of a polysilicon bar PLY in which the anode and cathode regions and the intrinsic region of the diode will be formed.

The formation of the bar may comprise deposition of a layer of polycrystalline silicon, then masking that defines portions to be removed, and etching.

Figure 11A:
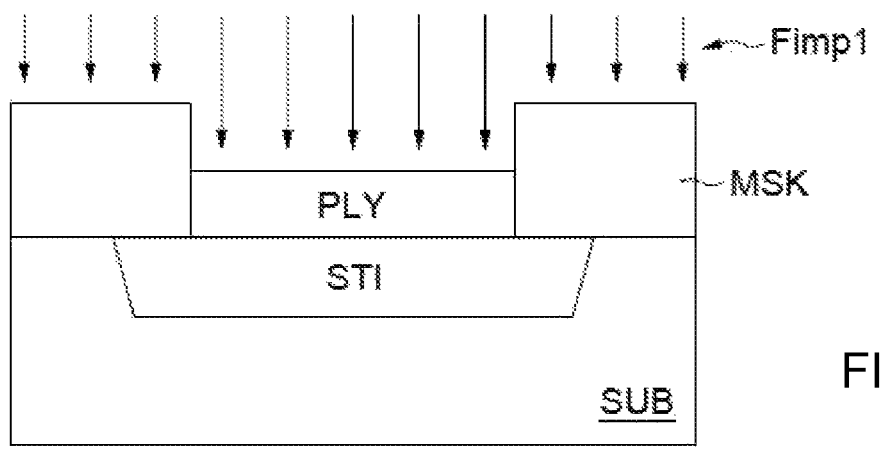
Figure 11B:
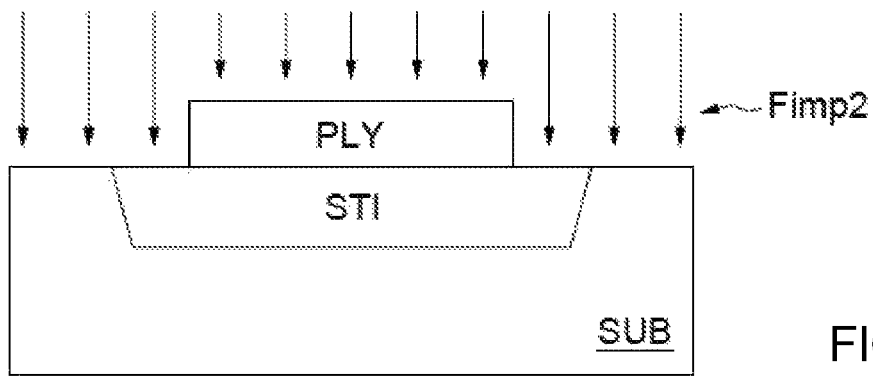

FIGS. 11A, 11B illustrate two alternatives for an implementation of an implantation of fluorine atoms Fimp1, Fimp2 in the polycrystalline silicon intrinsic region INT, immediately after the formation of the bar PLY.

In the two alternatives, the implantation of fluorine atoms Fimp1, Fimp2 is carried out throughout the polysilicon bar PLY, i.e. also in the future doped anode and cathode regions.

FIG. 11A represents an alternative in which said implantation of fluorine atoms Fimp1 comprises the use of a dedicated mask MSK that inhibits the implantation on masked portions.

In the example represented, the entire surface of the polysilicon bar PLY is uncovered. That being said, it is conceivable for the mask MSK to cover the ends of the bar PLY, level with the future doped anode and cathode regions.

The use of a mask for carrying out the implantation of fluorine Fimp1 in the polysilicon bar PLY makes it possible to be able to introduce this fabrication process together with other fabrications of components on the semiconductor substrate SUB, without necessitating an implantation of fluorine in said other fabrications.

FIG. 11B represents an alternative in which said implantation of fluorine atoms Fimp2 is a wafer-scale implantation, i.e. carried out with no mask, on the entire surface of the semiconductor substrate SUB, generally in the form of a wafer. Such an alternative makes it possible to avoid the use of a dedicated mask, but necessitates taking into consideration this implantation of fluorine in the characterization of the other components of the circuit formed on the substrate SUB.

The implantations of fluorine Fimp1, Fimp2 according to these two alternatives are configured at an energy that makes it possible to implant the fluorine in the polysilicon bar PLY, for example between 10 keV and 30 keV, and at a concentration for example of between $0.5*10^{15}$ at./cm$^2$ and $1.0*10^{16}$ at./cm$^2$.

For a bar PLY having a thickness of 150 nm, the concentration of fluorine atoms resulting in the intrinsic region INT is thus between $0.33*10^{20}$ at./cm$^3$ and $0.66*10^{21}$ at./cm$^3$.

Figure 12:
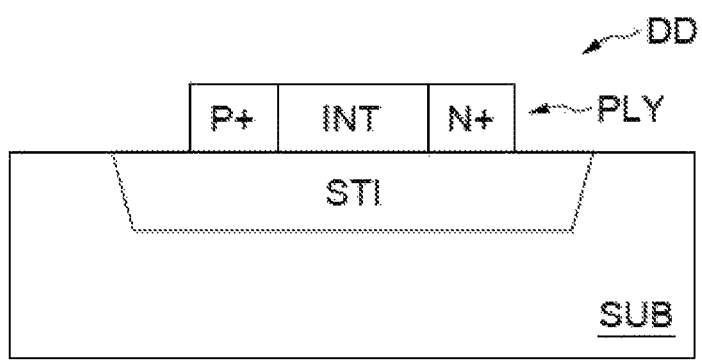

FIG. 12 represents a step of forming anode and cathode regions of the diode DD, comprising an implantation of dopants of a first type of conductivity P+ in a first region of the polysilicon bar PLY, and an implantation of dopants of a second type of conductivity N+ in a second region of the polysilicon bar PLY. The first doped region P+ and the second doped region N+ are arranged so as to leave an undoped intrinsic region INT intercalated between the anode first doped region P+ and the cathode second doped region N+.

Moreover, a step of localized silicidation may make it possible to form films of metal silicide at the surface of the anode and cathode regions in order to connect thereto respective contacts (as represented in FIG. 1).

Figure 13:
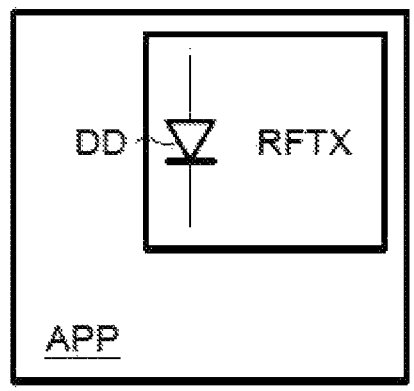
FIG. 13 schematically represents an electronic device which includes a diode.

FIG. 13 schematically represents an electronic device APP, comprising for example a transmission stage using radio frequencies RFTX, advantageously comprising at least one PIN-type diode DD, the intrinsic region INT of which comprises fluorine atoms, such as for example according to the embodiment described in connection with FIG. 7.

The invention claimed is:

1. A diode, comprising:
a polycrystalline silicon bar including a first doped region with a first conductivity type, a second doped region with a second conductivity type and an intrinsic region that is located between the first doped region and the second doped region;
a first conductive layer extending parallel to the polycrystalline silicon bar; and
a dielectric layer separating the first conductive layer from said polycrystalline silicon bar, wherein the dielectric layer includes a first portion positioned between the intrinsic region and the first conductive layer and a second portion positioned between each of the first and second doped regions and the first conductive layer, the first portion having a first thickness and the second portion having a second thickness greater than the first thickness;

wherein said first conductive layer is configured to be biased by a bias voltage.

2. The diode according to claim 1, wherein a thickness of the polycrystalline silicon bar is 150 nm or 100 nm.

3. The diode according to claim 1, wherein each of the first and second doped regions of the polycrystalline silicon bar have a third thickness and the intrinsic region the polycrystalline silicon bar has a fourth thickness greater than the third thickness.

4. The diode according to claim 1, wherein a part of the second portion is positioned between a part of the intrinsic region and the first conductive layer.

5. The diode according to claim 1, wherein the first thickness of the first portion is substantially 2.3 nm.

6. The diode according to claim 1, wherein the first thickness of the first portion is between 7 nm and 9 nm.

7. The diode according to claim 1, wherein second thickness of the second portion is substantially 15 nm.

8. The diode according to claim 1, wherein the second thickness of the second portion is substantially 18 nm.

9. The diode according to claim 1, wherein said first conductive layer is located on a surface on a front face of a semiconductor substrate.

10. The diode according to claim 9, wherein the front face is defined by a shallow trench isolation region in the semiconductor substrate.

11. The diode according to claim 1, wherein said first conductive layer is located in a trench extending vertically into a semiconductor substrate from a front face of the semiconductor substrate.

12. The diode according to claim 11, further comprising an insulating layer lining said trench to isolate the first conductive layer from the semiconductor substrate.

13. The diode according to claim 1, further comprising an electrical circuit coupling the first doped region of the polycrystalline silicon bar with the first conductive layer.

14. The diode according to claim 1, further comprising:
a second conductive layer extending parallel to the polycrystalline silicon bar;
a second dielectric layer separating the second conductive layer from said polycrystalline silicon bar;
wherein said second conductive layer is configured to be biased by a second bias voltage.

15. The diode according to claim 14, wherein the first conductive layer is located on one side of the polycrystalline silicon bar and the second conductive layer is located on an opposite side of the polycrystalline silicon bar.

16. The diode according to claim 14, wherein a thickness of the second conductive layer is 150 nm and a thickness of the polycrystalline silicon bar is 100 nm.

17. The diode according to claim 14, wherein said second dielectric layer includes a first portion and a second portion, wherein the first portion is thinner than the second portion, and wherein the first portion is positioned between the intrinsic region and the second conductive layer.

18. The diode according to claim 17, wherein a thickness of said first portion of the second dielectric layer is substantially 2.3 nm and a thickness of the second portion of the second dielectric layer is substantially 15 nm.

19. The diode according to claim 14, further comprising a second electrical circuit coupling the first doped region of the polycrystalline silicon bar with the second conductive layer.

20. The diode according to claim 1, further including an isolating region electrically isolating the diode from a semiconductor substrate.

21. The diode according to claim 1, wherein at least said intrinsic region of the polycrystalline silicon bar includes fluorine atoms.

22. A diode, comprising:
a substrate support;
a first conductive layer in contact with the substrate support and extending parallel to an upper surface of the substrate support;
a dielectric layer in contact with the first conductive layer and extending parallel to an upper surface of the first conductive layer;
wherein the dielectric layer includes a first portion having a first thickness and a second portion having a second thickness less than the first thickness; and
a polycrystalline silicon bar in contact with the dielectric layer and extending parallel to an upper surface of the dielectric layer;
wherein the polycrystalline silicon bar includes a first doped region with a first conductivity type separated from the conductive layer by the first portion of the dielectric layer, a second doped region with a second conductivity type separated from the conductive layer by the first portion of the dielectric layer and an intrinsic region that is located between the first doped region and the second doped region separated from the conductive layer by the second portion of the dielectric layer.

23. The diode according to claim 22, wherein said first conductive layer is configured to be biased by a first bias voltage.

24. The diode according to claim 22, wherein a thickness of the polycrystalline silicon bar is from 100-150 nm.

25. The diode according to claim 1, wherein a part of the second portion is positioned between a part of the intrinsic region and the first conductive layer.

26. The diode according to claim 1, wherein the first thickness of the first portion is from 2-9 nm and the second thickness of the second portion is from 15-18 nm.

27. The diode according to claim 22, wherein said substrate support is a surface on a front face of a semiconductor substrate.

28. The diode according to claim 27, wherein the front face is defined by a shallow trench isolation region in the semiconductor substrate.

29. The diode according to claim 22, wherein said substrate support is a trench within a semiconductor substrate.

30. The diode according to claim 29, further comprising an insulating layer lining said trench to isolate the first conductive layer from the semiconductor substrate.

31. The diode according to claim 22, further comprising an electrical circuit coupling the first doped region of the polycrystalline silicon bar with the first conductive layer.

32. The diode according to claim 22, further comprising:
a second conductive layer extending parallel to the polycrystalline silicon bar; and
a second dielectric layer separating the second conductive layer from said polycrystalline silicon bar.

33. The diode according to claim 32, wherein said first conductive layer is configured to be biased by a first bias voltage and wherein said second conductive layer is configured to be biased by a second bias voltage.

34. The diode according to claim 32, wherein the first conductive layer is located on one side of the polycrystalline silicon bar and the second conductive layer is located on an opposite side of the polycrystalline silicon bar.

35. The diode according to claim 32, wherein a thickness of the second conductive layer is 150 nm and a thickness of the polycrystalline silicon bar is 100 nm.

36. The diode according to claim 32, wherein said second dielectric layer includes a first portion and a second portion, wherein the first portion is thinner than the second portion, and wherein the first portion is positioned between the intrinsic region and the second conductive layer.

37. The diode according to claim 36, wherein a thickness of said first portion of the second dielectric layer is substantially 2.3 nm and a thickness of the second portion of the second dielectric layer is substantially 15 nm.

38. The diode according to claim 32, further comprising a second electrical circuit coupling the first doped region of the polycrystalline silicon bar with the second conductive layer.

39. The diode according to claim 22, further including an isolating region electrically isolating the diode from a semiconductor substrate.

40. The diode according to claim 22, wherein at least said intrinsic region of the polycrystalline silicon bar includes fluorine atoms.

* * * * *